United States Patent [19]

Schreiber

[11] Patent Number: 4,961,259
[45] Date of Patent: Oct. 9, 1990

[54] METHOD OF FORMING AN INTERCONNECTION BY AN EXCIMER LASER

[75] Inventor: Christopher M. Schreiber, Rancho Santa Margarita, Calif.

[73] Assignee: Hughes Aircraft Company, Los Angeles, Calif.

[21] Appl. No.: 367,278

[22] Filed: Jun. 16, 1989

[51] Int. Cl.$^5$ ............................................. H05K 3/02
[52] U.S. Cl. ...................................... 29/852; 174/262; 204/15; 219/121.68; 219/121.69; 427/96; 427/97
[58] Field of Search ................. 29/846, 852; 174/68.5, 174/262; 427/96, 97; 219/121.68, 121.69; 204/15

[56] References Cited

U.S. PATENT DOCUMENTS

| | | | |
|---|---|---|---|
| 4,076,575 | 2/1978 | Chang | 29/846 X |
| 4,116,517 | 9/1978 | Selvin et al. | |
| 4,453,795 | 6/1984 | Moulin | |
| 4,657,778 | 4/1987 | Moran | 29/846 X |
| 4,707,394 | 11/1987 | Chant | 29/846 X |
| 4,780,177 | 10/1988 | Wojnarowski et al. | 29/846 X |
| 4,797,508 | 1/1989 | Chant | 29/846 X |

OTHER PUBLICATIONS

R. Srinivasan, Ablation of Polymers and Biological Tissue by Ultraviolet Lasers, Oct. 31, 1986, Science, vol. 234, pp. 559-565.
Srinivasan et al., Mechanism of the Ultraviolet Laser Ablation of Polymethyl Metharcylate at 193 and 248 nm; Laser-Induced Fluorescence Analysis, Chemical Analysis, and Doping Studies, May 1986, vol. 3, No. 5/J. Opt.Soc. Am. B., pp. 785-791.
R. Srinivasan Ultraviolet Laser Ablation of Organic Polymer Films/IBM, Thomas J. Watson Research Center, pp. 343-354.
R. Srinivasan and B. Braren, Ultraviolet Laser Ablation and Etching of Polymethyl Methacrylate Sensitized with an Organic Dopant, Appl. Phys. A45, 289-292 (1988).

Primary Examiner—Carl E. Hall
Assistant Examiner—Carl J. Arbes
Attorney, Agent, or Firm—Joseph E. Szabo; Terje Gudmestad; Wanda K. Denson-Low

[57] ABSTRACT

A raised metal connection feature (29) is created by forming a conductive pad (17) on a flexible substrate (11) and applying a flexible dielectric insulator (19) and photoresist layer (21) over the conductive pad (17). An excimer laser (25) is used to ablate a via (27) through the dielectric insulator (19) and photoresist (21) to the conductive pad (17). Gold or other metal is then plated up in the via (17), and the photoresist (21) is removed, leaving a metal feature (29) extending above the dielectric insulator (19).

8 Claims, 1 Drawing Sheet

METHOD OF FORMING AN INTERCONNECTION BY AN EXCIMER LASER

BACKGROUND OF THE INVENTION

1. Field of the Invention

The subject invention relates to flexible printed circuit fabrication and, more particularly, to a method for defining and building raised metal features for use in connection applications.

2. Description of Related Art

Various applications exist where it is desirable to form raised metal connection features above a surface. One such application is in the formation of connector assemblies wherein such raised features form interconnection contact points on flexible structures, for example, as illustrated in U.S. Pat. No. 4,453,795 assigned to Hughes Aircraft Company. According to the disclosure of that patent, a first wafer has copper contact pads on which are formed raised metal connector features in the form of copper buttons. A second wafer has copper pads located to mate with the copper buttons. The first and second wafers are then aligned and compressed together to establish connection between the copper buttons of the first wafer and the pads of the second wafer.

The conventional method of creating raised metal connection features, such as the copper buttons of the '795 patent, requires multiple photolithographic steps. First, photoresist is laminated, exposed and developed three times to create a circuit with an interconnection feature which extends above an acrylic adhesive dielectric film substrate surface 0.002 to 0.003 inches. Then photoresist is "tented" around the raised feature and another photoetch step is performed to define circuitry on a copper pad located on the substrate. Finally, a predrilled coverlay is applied over the circuitry, and gold plating is applied to the areas exposed by the coverlay to define the feature.

The foregoing process has several problems. Numerous steps are required, resulting in a labor-intensive procedure. Second, trying to tent photoresist around the raised feature is difficult and frequently results in voids. Additionally, the raised feature holds the coverlay off the copper pad, resulting in poor line definition. Finally, alignment of a predrilled coverlay is difficult and still leaves exposed copper on the pad area which must be gold plated. Gold plating degrades exposed areas of the acrylic adhesive substrate.

SUMMARY OF THE INVENTION

It is therefore an object of the invention to improve procedures for defining and building raised metal connection features;

It is another object of the invention to reduce the number of steps in such a procedure over those conventionally employed; and It is another object to provide a simplified procedure which eliminates sources of inaccuracies and degradation in the prior art.

According to the process of the invention, metal connection features are established after completion of processes which tend to induce dimensional changes such as lamination and etching. According to the process of the invention, an etched circuit is covered with a dielectric film insulator. The circuit is then laminated with a masking layer such as a plating resist. The feature location is then established by ablating the masking layer and the underlying dielectric film using a laser. Subsequently, the feature is plated up in the ablated location and the masking layer is stripped away, leaving the feature extending above the dielectric surface.

The method of the invention thus achieves the formation of a feature possessing enough height above the dielectric to achieve an interconnect. Additionally, the method allows for more precise placement of connecting features, since the features are placed after the product has completed processes which tend to induce dimensional changes. Finally, the laser will ablate features smaller than those obtainable by conventional photolithography, thereby allowing increased interconnection density.

BRIEF DESCRIPTION OF THE DRAWINGS

The preferred embodiment of the just-summarized invention will now be described in detail in conjunction with the drawings, of which.

DESCRIPTION OF THE PREFERRED EMBODIMENTS

Figure 1:
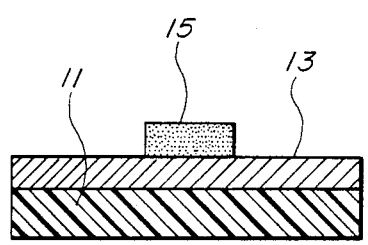
FIGS. 1-6 are cross-sectional drawings illustrating various stages in the construction of a raised metal feature according to the preferred embodiment.

FIG. 1 illustrates a flexible dielectric film substrate 11, typically formed of Pyralux TM available from DuPont, Wilmington, Del. Many other known materials may be used for the dielectric film, such as polyimide, polyimide with an acrylic adhesive, polyester, and teflon. A copper conductor layer 13, approximately 0.0014 inches thick, is formed on the substrate 11 by conventional printed circuit fabrication procedures such as lamination.

An exposed photoresist layer 15 is formed on the copper conductor layer 13. The exposed photoresist layer 15 is of a width such as 0.020 inches.

The width is selected to define a pad in the layer 13 on which a connection feature will ultimately be formed.

To form the resist portion 15, the conductive layer 13 is coated with a photosensitive resist. The resist may be laminated onto the conductive layer 13 using a photoresist laminator, a device well-known in the art. With a photoresist laminator, photoresist is rolled on using heat and pressure. The approximate temperature used in the heating process is 225°-250° F.

The applied photosensitive resist is then exposed through a mask, thereby defining the portion 15, in an "exposure unit," a commercial well-known exposure device. The exposure unit (not shown) polymerizes the unmasked resist 15 by subjecting it to ultraviolet (UV) radiation. The resist is then developed. The developer solution removes the unpolymerized resist (the resist which was unexposed because it was masked), leaving the exposed or polymerized portion 15.

An alternate method of defining the portion 15 would be to print the pattern using a silk screen and an alkali soluble etch resist. This alternative would eliminate the resist lamination, exposure and developing processes. Vinyl, polyvinyl or latex may also be used in lieu of photoresist, as known in the art.

Figure 2:
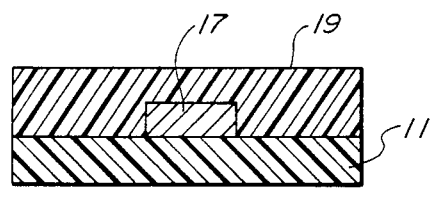

After the photoresist 15 is formed, a conventional etching step is performed and the photoresist 15 is stripped away, resulting in formation of a pad 17, as shown in FIG. 2.

As further shown in FIG. 2, a flexible dielectric film insulator 19 is formed over the pad 17 at a thickness of, e.g., 0.001–0.002 in. Pyralux ™ again may be used as the dielectric film insulator 19. Pyralux ™ is a staged cast resin which is laminated under pressure and temperature. Many other known dielectric film materials again could be used.

Figure 3:
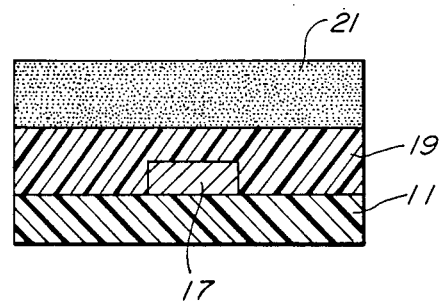

After the Pyralux ™ insulator layer 19 is applied, a layer 21 of photoresist is laminated onto the layer 19, as shown in FIG. 3. At this stage, the part comprising layers 11, 19, 21 and the copper pad 17 are ready for laser ablation.

Figure 4:
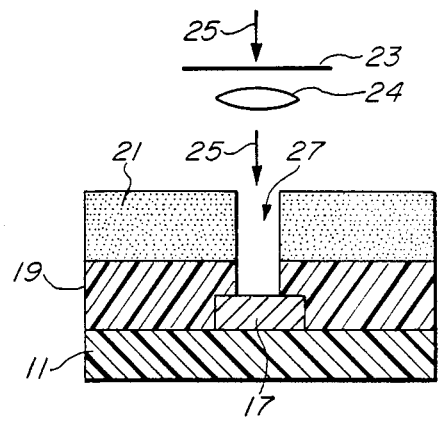

As shown in FIG. 4, a laser beam 25 is interrupted by an off-contact mask 23 and focused on the workpiece by suitable optics, shown schematically at 24. The mask 23 contains openings which, by interrupting and guiding the laser beam 25, define the desired features on the workpiece.

As shown in FIG. 4, the focused laser light 25 ablates a feature opening or "via" 27 in the structure. The opening or via 27 extends through the photoresist and the Pyralux ™ dielectric film layers 19, 21 to the surface of the copper pad 17.

The laser employed is preferably an excimer laser emitting laser pulses of a 248-nanometer (nm) wavelength. The laser is used to ablate a via 27 having a depth of, for example, 0.005 to 0.008 inches.

Figure 5:
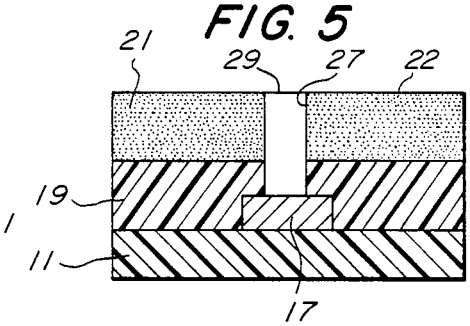

With the via 27 thus defined, copper 29 is electrolytically deposited in the opening 27 by a conventional electrolytic deposition procedure, as illustrated in FIG. 5. The copper 29 is built up level with the top surface 22 of the photoresist layer 21.

Figure 6:
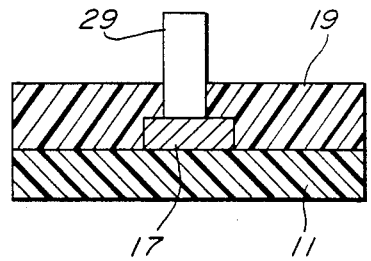

Finally, as shown in FIG. 6, the photoresist layer 21 is stripped away, leaving the desired feature 29 formed upon the pad 17 and extending above the Pyralux ™ insulator layer 19 a sufficient distance to achieve interconnection with a connection pad located on, e.g., a mother board.

As will be appreciated, the just-described method eliminates numerous steps attendant to the conventional method of forming features such as feature 29. The feature 29 is also deposited after the etching process which forms the pad 17, thereby contributing to more precise feature placement. Finally, laser ablating as illustrated in FIG. 4 provides for creation of smaller features: and, hence, increased interconnection density.

For simplicity of discussion, the creation of one metal feature 29 has been described. Those skilled in the art will appreciate that the method of the preferred embodiment is applicable to creating various patterns of a large number of such features, using various appropriately constructed masks such as mask 23.

Those skilled in the art will further appreciate that numerous adaptations and modifications in the preferred embodiment may be made without departing from the scope and spirit of the invention. Therefore, it is to be understood that, within the scope of the appended claims, the invention may be practiced other than as specifically described above.

What is claimed is:

1. A method of forming an interconnection feature comprising the steps of:
    forming a conductive layer on a substrate;
    forming a conductor pad from said conductive layer;
    forming a dielectric insulator film over said pad;
    forming a masking layer on said dielectric insulator film;
    ablating said masking layer and dielectric insulator film to form a via, said via leading to said pad;
    inserting conductive material in said via, said conductive material filling at least a portion of the via above the dielectric insulator film; and
    removing said mask layer to form said feature.

2. The method of claim 1 wherein said step of ablating comprises ablating said masking layer and dielectric insulator film with a laser.

3. The method of claim 2 wherein said laser comprises an excimer laser.

4. The method of forming an interconnection feature of claim 1 wherein said step of ablating comprises:
    positioning a mask with respect to said masking layer, said mask including means for defining said feature; and
    passing a laser light beam through said mask to ablate said masking layer and said dielectric insulator film.

5. The method of claim 4 wherein said step of forming a dielectric insulator film comprises applying a staged cast resin over said pad.

6. The method of claim 5 wherein said mask layer comprises a photoresist layer and said step of removing comprises stripping away said photoresist.

7. The method of claim 4 wherein said step of passing a laser light beam includes the step of generating said laser light beam with an excimer laser.

8. The method of claim 7 wherein said excimer laser generates a wavelength of 248 nanometers.

* * * * *